(12) United States Patent
Bonvalot et al.

(10) Patent No.: US 7,282,424 B2
(45) Date of Patent: Oct. 16, 2007

(54) METHOD OF MANUFACTURING A PLURALITY OF ASSEMBLIES

(75) Inventors: Béatrice Bonvalot, Bures sur Yvette (FR); Sylvie Barbe, Puiselet le Marais (FR); Laurent Le Moullec, Paris (FR); Robert Leydier, Orsay (FR)

(73) Assignee: Axalto SA, Meudon (FR)

( * ) Notice: Subject to any disclaimer, the term of this patent is extended or adjusted under 35 U.S.C. 154(b) by 180 days.

(21) Appl. No.: 10/494,881

(22) PCT Filed: Nov. 6, 2002

(86) PCT No.: PCT/IB02/04655

§ 371 (c)(1),
(2), (4) Date: May 7, 2004

(87) PCT Pub. No.: WO03/041154

PCT Pub. Date: May 15, 2003

(65) Prior Publication Data

US 2005/0009247 A1    Jan. 13, 2005

(30) Foreign Application Priority Data

Nov. 7, 2001 (FR) .................................. 01 14577

(51) Int. Cl.
*H01L 21/30* (2006.01)

(52) U.S. Cl. .............................. 438/455; 257/E21.499
(58) Field of Classification Search ................ 438/106, 438/118, 455
See application file for complete search history.

(56) References Cited

U.S. PATENT DOCUMENTS 6,027,958 A * 2/2000 Vu et al. ..................... 438/110
6,398,892 B1 * 6/2002 Noguchi et al. .............. 156/85

* cited by examiner

*Primary Examiner*—Scott B. Geyer
(74) *Attorney, Agent, or Firm*—The Jansson Firm; Pehr Jansson

(57) ABSTRACT

A plurality of assemblies is manufactured. Each assembly comprises a sealing slice that is fixed to a base slice. The plurality of assemblies is manufactured in the following manner. In a preparation step, a stack is formed. The stack comprises a plurality of pre-assemblies. Each pre-assembly comprises a base slice, a sealing slice and a fixing layer provided between the base slice and the sealing slice. The stack further comprises at least one supple buffer layer. The supple buffer layer has a mechanical rigidity, which is substantially less than that of the base slices and that of the sealing slices. The supple buffer layer thus enables to compensate for variations in thickness of the base slices and of the sealing slices. In a fixing step, the stack is pressed which causes the sealing slice of each pre-assembly to be fixed to the base-slice of the pre-assembly.

9 Claims, 2 Drawing Sheets

METHOD OF MANUFACTURING A PLURALITY OF ASSEMBLIES

BACKGROUND OF THE INVENTION

1. Field of the Invention

The invention concerns a method of manufacturing a plurality of assemblies. An assembly comprises a sealing slice that is fixed to a base slice. The sealing slice and the base slice can be, for example, two silicon wafers.

2. Description of the Related Art

The French patent application number 2 767 966 concerns a secured integrated circuit device. The device includes an active layer with a semiconducting material and circuits integrated with the semiconducting material. This active layer includes an active side on which there are contact studs. An additional layer is then bonded to this active layer via an intermediate fixing layer, for example a thermosetting plastic. This fixing layer is deposited in the viscous state. Apart from its bonding properties, it is resistant to the traditional solvents.

Generally, its properties of bonding and resistance to solvents are temperature activated. During this activation, redundant products are formed in the intermediate fixing layer. Some redundant products are products resulting from various intermediate chemical reactions occurring, in particular, as a result of this activation. Other redundant products are solvents, especially solvents required to ensure that activation occurs correctly.

SUMMARY OF THE INVENTION

One objective of the invention is to manufacture a plurality of assemblies with an enhanced quality.

According to one aspect of this invention, a method of manufacturing a plurality of assemblies, each assembly comprising a sealing slice that is fixed to a base slice, the method comprising:

a preparation step, in which a stack is formed, the stack comprising a plurality of pre-assemblies, each pre-assembly comprising a base slice, a sealing slice and a fixing layer provided between the base slice and the sealing slice, the stack further comprising at least one supple buffer layer whose mechanical rigidity is substantially less than that of the base slices and that of the sealing slices, so as to compensate for variations in thickness of the base slices and of the sealing slices;

a fixing step, in which the stack is pressed which causes the sealing slice of each pre-assembly to be fixed to the base-slice of the pre-assembly.

The invention takes the following aspects into consideration. Generally the thickness of a sealing slice and that of a base slice varies. This variation of the thickness is, in particular, due to some geometric faults and to a particular roughness of the surfaces of theses slices. When various assemblies are stacked, the effects of these geometric variations are multiplied. The supple buffer layer ensures that the pressure exerted during the fixing step on each pre-assembly, is applied more uniformly thus compensating for variations in thickness of the base slices and of the sealing slices. This allows a better fixation quality. The invention enables therefore to manufacture a plurality of assemblies with an enhanced quality.

BRIEF DESCRIPTION OF THE DRAWINGS

It will be easier to understand the invention on reading the non limiting description below, written with reference to the accompanying drawings, where.

DESCRIPTION OF THE INVENTION

Figure 1:
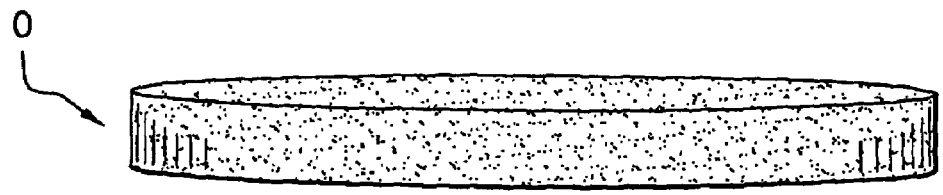
FIG. 1 illustrates a silicon wafer.

FIG. 1 illustrates the first silicon wafer 0. This wafer includes active elements, for example electrical circuits, and contact studs.

Figure 2:
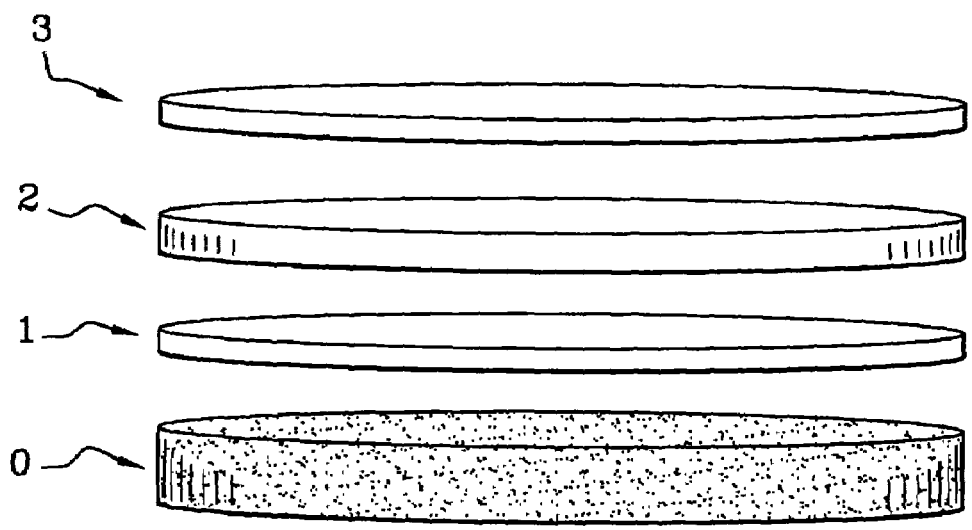
FIG. 2 illustrates a deposition step.

FIG. 2 illustrates a deposition step. In this step, an adhesive layer 2 and, optionally, auxiliary layers 1 and 3 are deposited on the first silicon wafer 0. The auxiliary layers 1 and 3 include one or more adhesion and impermeability agents.

The adhesive layer 2 is preferably obtained from a polyimide dispensed as an acid or ether polyamic in solution. The thickness of the adhesive layer 2 is preferably between 2 μm and 30 μm.

The auxiliary layers 1 and 3 are preferably organosilanes. They are deposited in liquid or viscous state in a solvated form, for example by centrifuging. The auxiliary layers 1 and 3 are, for example, several dozen nanometres thick. The auxiliary layers 1 and 3 are preferably heated then cooled to improve the adhesion and impermeability properties.

The assembly consisting of the first wafer 0 and the layers 1, 2 and 3 deposited above is, preferably, heated. Consequently, the solvents contained in layers 1, 2 and 3 evaporate. Another advantage of this heating is that it fastens together the first wafer 0 and the layers 1, 2 and 3, making it easier to handle the assembly. The heating also helps to adapt to the roughness due to the presence of the active elements on the first silicon wafer 0.

Figure 3:
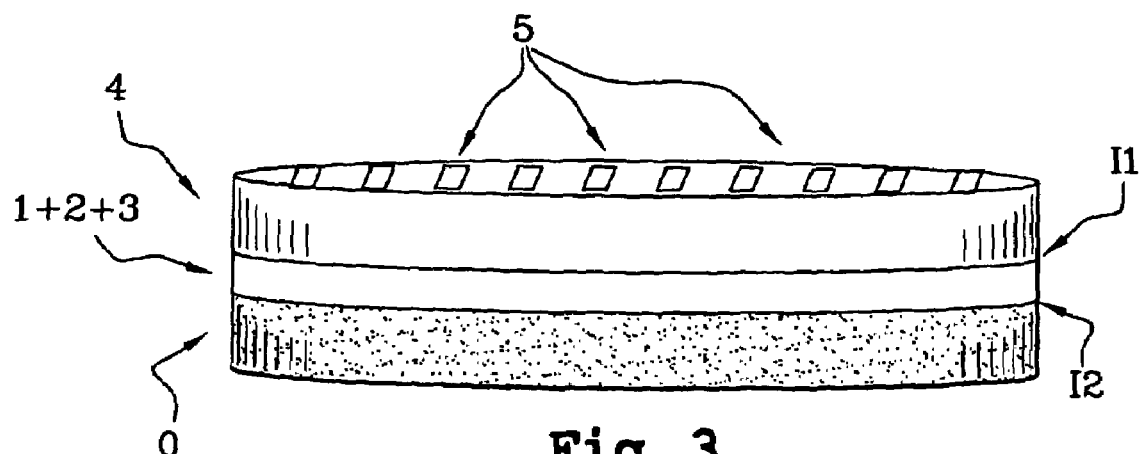
FIG. 3 illustrates a positioning step.

FIG. 3 illustrates a positioning step in which a second silicon wafer 4 is put in contact with the assembly illustrated on FIG. 2. The second silicon wafer 4 is pierced with through-holes 5. The positioning is carried out so that one or more through-holes 5 are opposite the contact studs of the first silicon wafer 0. Layers 1, 2 and 3 can also be pierced with through-holes opposite the contact studs, for example by engraving or exposure. The first silicon wafer can therefore be connected electrically to an external element using a wire. One or more electrical connections can also be made between the two silicon wafers 0 and 4.

The assembly formed by the first silicon wafer 0, the layers 1, 2 and 3 and the second silicon wafer 4 will be referred to hereafter as the wafer assembly.

Figure 4:
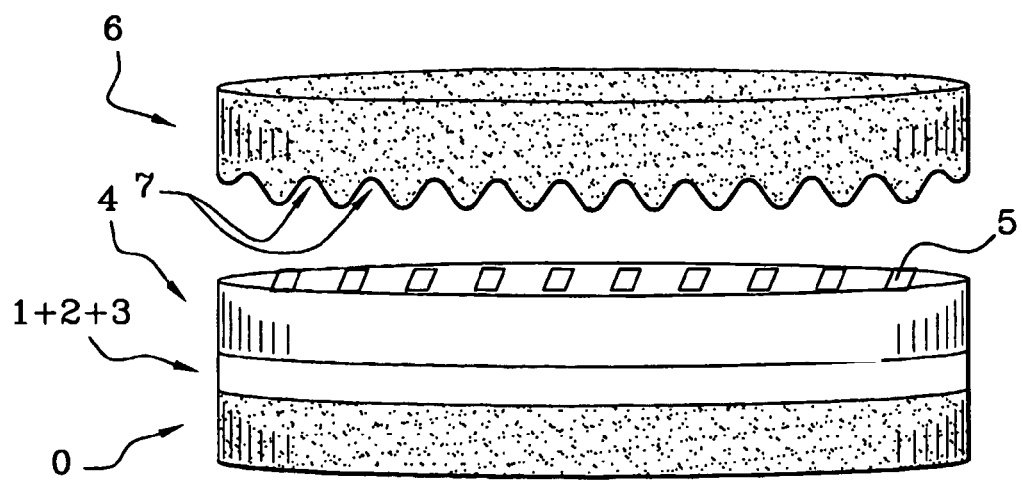
FIG. 4 illustrates a sealing step.

FIG. 4 illustrates a sealing step, in which the wafer assembly undergoes the following treatment. An evacuation plate 6 is placed on the second silicon wafer 4. This evacuation plate is equipped with channels 7, preferably opening out on the sides of the evacuation plate 6. These open channels 7 are used to evacuate the redundant products contained in the layers 1, 2 and 3. This evacuation occurs by degassing via the through-holes 5 of the second silicon wafer 4.

In the sealing step, the wafer assembly is heated to evacuate the redundant products by degassing and allow chemical reactions in layers 1, 2 and 3 to take place. In particular, the temperature must be greater than the boiling points of the solvents present in layers 1, 2 and 3 to enable their degassing. If the temperature is too high, however, the bonding properties of layers 1, 2, and 3 deteriorate. For example, if the layer of adhesive 2 consists of polyimide, a temperature comprised between 200° C. and 400° C. is suitable; it can be in particular 270° C. Advantageously, during this sealing step the ramp-up of the temperature is controlled so that the degassing does not happen with a too high degassing flux.

Pressure is applied uniformly over the wafer assembly, for example using a press. For example, a pressure of 3 bars, applied for a period of 4 hours, is suitable.

Note that the auxiliary layers 1 and 3 improve the adhesion of the layer of adhesive 2 on the silicon wafers 0 and 4. In addition, the auxiliary layers 1 and 3 increase the impermeability of the bonding of the silicon wafers 0 and 4. The bond will therefore be less sensitive to chemical attack, for example.

Figure 5:
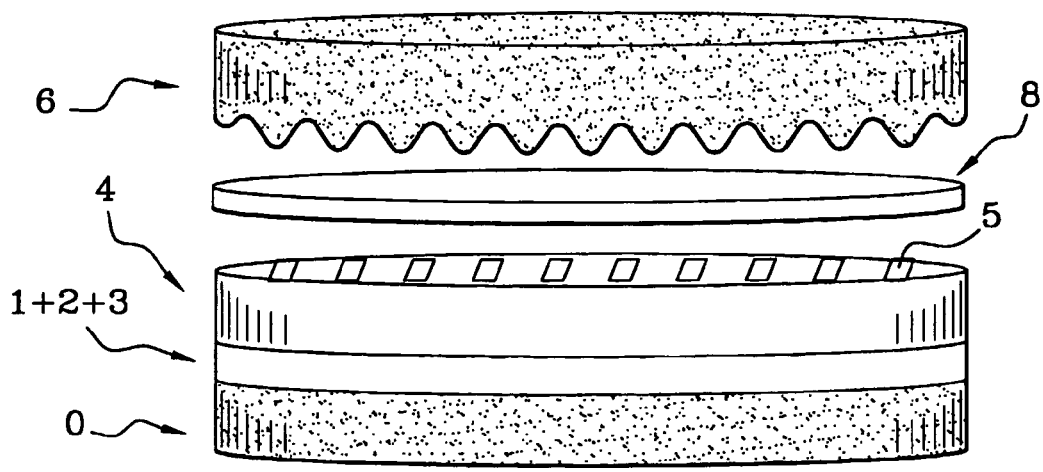
FIG. 5 illustrates an advantageous variant of the sealing step.

FIG. 5 illustrates the following aspect. A flexible membrane 8 with porosity and creep properties can be inserted between the second silicon wafer 4 pierced with through-holes 5 and the evacuation plate 6 equipped with evacuation channels 7. The flexible membrane 8 is made of a porous material so that the redundant products can be evacuated via the evacuation channels 7 in the evacuation plate 6 during degassing. The porous material can be, for example, a fibrous membrane made of expanded polytetrafluorethylene (PTFE). The water entry pressure of a membrane can be used to define the porosity of the material. We can used, for example, a flexible membrane made of expanded PTFE whose water entry pressure is, for example greater than 0.05 bar/60 sec and, preferably greater than 0.6 bar/60 sec. Such a flexible membrane 8 may be distributed by the GORE company (registered trademark). Advantageously, in the case of a silicon wafer having a total thickness variation (TTV) comprised between 0.1 μm and 25 μm, a flexible membrane having a thickness which is, for example, at least equal to the total thickness variation and which is preferably comprised between 50 μm and 2 mm, can be used. The flexible membrane 8 thus ensures that the various pressure forces exerted during the sealing step are applied uniformly. This reduces the effects of any geometric faults in the silicon wafers and possibly the effects of rough areas mainly due to the presence of active elements. Advantageously, the flexible membrane 8 is made of a material, which does not substantially chemically react with the second silicon wafer 4, the evacuation plate 6 and the redundant products. For example, the expanded PTFE is also a material that can be advantageously used to this purpose.

After the sealing step, redundant products still remains in the fixing layer 2. To ensure that the bond is relatively resistant, it is best to evacuate these remaining redundant products.

Figure 6:
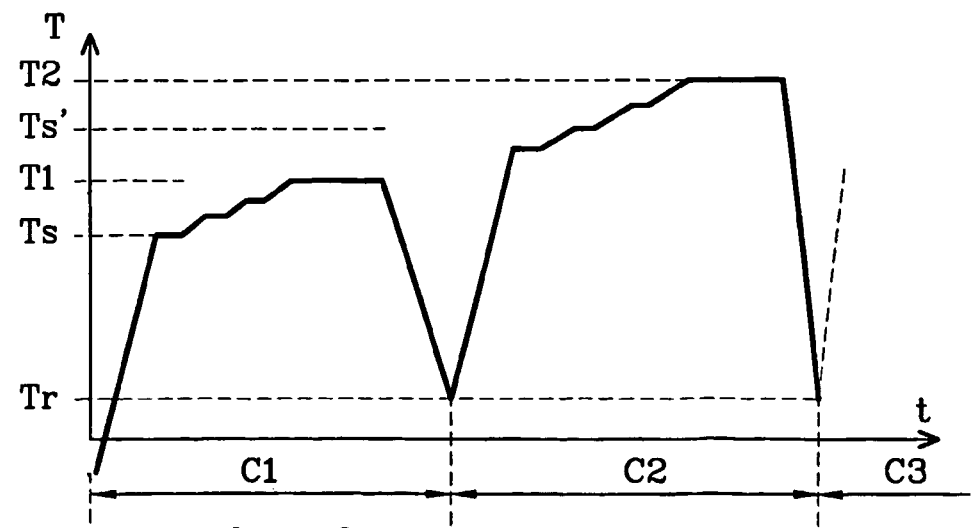
FIG. 6 illustrates an evacuation step.

FIG. 6 illustrates an evacuation step. This step is used to evacuate the remaining redundant products. In addition, it allows chemical reactions to take place in the layer of adhesive 2, which also help to improve the bonding strength.

More precisely, FIG. 6 illustrates the heating and cooling cycles C1 and C2 of the wafer assembly. The horizontal axis represents time, the vertical axis the temperature to which the wafer assembly is exposed. In cycle C1, the temperature increases rapidly up to a sealing temperature Ts. Then the rate of temperature rise slows down considerably. This rise is interrupted by stages of constant temperature, preferably every 10° C., until it reaches a long degassing phase at constant temperature T1. The temperature then drops down to a temperature Tr, well below the sealing temperature Ts. Cycle C2 is similar to cycle C1. In cycle C2, the degassing phase takes place at a temperature T2 which is greater than T1 in cycle C1.

This succession of cycles causes a type of thermal pumping effect. Almost all the redundant products in the layer of adhesive 2 can therefore be evacuated. This ensures that the bonding of the wafers is relatively resistant.

Preferably, the sealing step and the evacuation step are carried out with several wafer assemblies. The assemblies are simply stacked on top of each other and subjected simultaneously to the sealing step and the evacuation step. To simplify this stacking, the wafer assemblies can be individually pre-sealed in a step introduced before the sealing step. This pre-sealing step can be carried out, for example, by thermo-compression at a relatively low temperature. A pressure of 3 bars at a temperature of 60° C. for 15 minutes gives satisfactory results.

Moreover, it is advantageous to clean the contact studs just after the pre-sealing, preferably by ionic bombardment.

When various wafer assemblies are stacked, the effects of the geometric faults and the surface roughness are multiplied. The use of a flexible membrane 8 illustrated on FIG. 6 will therefore be particularly advantageous.

The method described previously illustrates the following characteristics. A plurality of assemblies is manufactured. Each assembly comprises a sealing slice that is fixed to a base slice. The plurality of assemblies is manufactured in the following manner. In a preparation step, a stack is formed. The stack comprises a plurality of pre-assemblies. Each pre-assembly comprises a base slice, a sealing slice and a fixing layer provided between the base slice and the sealing slice. The stack further comprises at least one supple buffer layer. The supple buffer layer has a mechanical rigidity, which is substantially less than that of the base slices and that of the sealing slices. The supple buffer layer thus enables to compensate for variations in thickness of the base slices and of the sealing slices. In a fixing step, the stack is pressed which causes the sealing slice of each pre-assembly to be fixed to the base-slice of the pre-assembly.

Obviously, the description of the mode of realisation described above does not limit the invention, which must be understood in the broad sense.

In the above-mentioned description, a flexible fibrous membrane 8 made of expanded PTFE has been used. Other fibrous material can also be used, for example, some fibrous composite material, in particular, a fibrous composite material like silicon carbon or a fibrous composite material comprising glass and PTFE. More generally one can use any flexible membrane, which is porous enough, so that redundant elements can be evacuated from the fixing layer. But the invention is not limited to the case in which redundant elements have to be evacuated from the fixing layer. In this case the flexible porous membrane can be replaced by any supple buffer layer whose mechanical rigidity is substantially less than that of the base slices and that of the sealing slices, thus enabling to compensate for variations in thickness of the base slices and of the sealing slices.

Advantageously, the supple buffer layer is chemically inert so that the supple buffer layer does not substantially chemically react with a part of the assembly and, if any, with the redundant products and; also so that the supple buffer layer can resist to the temperature applied during the process.

Note that the use of a supple buffer layer is not limited to the case in which an evacuation plate is used. For example, various wafer assemblies can be stacked without using any evacuation plate. In particular, a supple buffer layer can be inserted between a second silicon wafer of a first assembly and the first silicon wafer of a next assembly. In this case, evacuation channels could be placed directly in a second silicon wafer or in a fixing layer. More generally, the invention can be applied in the case in which no redundant elements have to be evacuated from the fixing layer. In that case, one can use any supple buffer layer whose mechanical rigidity is substantially less than that of the base slices and that of the sealing slices, thus enabling to compensate for variations in thickness of the base slices and of the sealing slices.

The adhesive layer 2 in the mode of realisation described previously is a polyimide. Generally, this method is suitable for any fixing layer that can be heated so that;gas is released from the fixing layer. This could be for example thermosetting plastics with creep properties and which are temperature stable above the temperature of decomposition of the active elements present in particular on the first silicon wafer. More generally one can use any fixing layer, which can be arranged to fix a base slice to a sealing slice.

In the above-mentioned description, the base-objects and the sealing objects are silicon wafers comprising or not integrated circuits. But it can be other objects than silicon wafers. It is, for example, possible to replace a silicon wafer by a wafer, a slice or a substrate made of a material other than silicon.

In the mode of realisation described previously, the evacuation plate is equipped with open channels. More generally, one can use any evacuation device arranged to evacuate redundant products contained in the fixing layer. For example, it is possible to have channels opening out directly on a sealing-slice, thereby avoiding the need for the evacuation plate as such.

Note that the total thickness variation (TTV) of a layer is the difference between the biggest thickness of the layer and the smallest thickness of the layer. The TTV may be, for example, due to geometrical defaults of the layer or to the presence of specific elements.

Although specific embodiments of the invention have been described and illustrated, the invention is not to be limited to the specific forms or arrangements of parts so descried and illustrated. The invention is limited only by the claims.

The invention claimed is:

1. A method of manufacturing a plurality of assemblies, each assembly comprising a sealing slice that is fixed to a base slice, the method comprising: a preparation step, in which a stack is formed, the stack comprising a plurality of pre-assemblies, each pre-assembly comprising a base slice, a sealing slice and a fixing layer provided between the base slice and the sealing slice, the stack further comprising at least one supple buffer layer whose mechanical rigidity is substantially less than that of the base slices and that of the sealing slices, so as to compensate for variations in thickness of the base slices and of the sealing slices; a fixing step, in which the stack is pressed which causes the sealing slice of each pre-assembly to be fixed to the base-slice of the pre-assembly.

2. The method according to claim 1, wherein the base slice of an assembly is a semiconductor material.

3. The method according to claim 1 wherein the base slice is in the form of a wafer comprising integrated circuits.

4. The method according to claim 1, wherein in the preparation step, an evacuation plate is placed onto the sealing slice of a pre-assembly and wherein the supple buffer layer is placed between the sealing slice of the pre-assembly and the evacuation plate.

5. The method according to claim 4, wherein the supple buffer layer is made of a porous material.

6. The method according to claim 5, wherein the porous material is a fibrous material.

7. The method according to claim 6, wherein the fibrous material comprises expanded PTFE.

8. The method according to claim 5, wherein the porous material has a water entry pressure, which is greater than 0.05 bar/60 sec.

9. The method according to claim 1, wherein the supple buffer layer is chemically inert.

* * * * *